United States Patent
Drennen et al.

(12)

(10) Patent No.: US 6,222,741 B1
(45) Date of Patent: Apr. 24, 2001

(54) MOUNTING ARRANGEMENT FOR MICROWAVE POWER AMPLIFIER

(75) Inventors: William Anthony Drennen, Oceanside; David C. Stillinger, Cardiff, both of CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 09/146,832

(22) Filed: Sep. 4, 1998

(51) Int. Cl.[7] ........................................ H05K 7/14
(52) U.S. Cl. ........................ 361/799; 361/707; 361/706
(58) Field of Search ............................ 361/799, 753, 361/737, 816, 818, 704, 706, 707, 708, 709, 710, 711, 712, 713, 714, 752, 757, 760, 715, 718, 722; 174/35 R

(56) References Cited

U.S. PATENT DOCUMENTS 5,206,796 * 4/1993 Thompson et al. .................. 361/818
5,353,200 * 10/1994 Bodin et al ......................... 361/816

* cited by examiner

Primary Examiner—Jeffrey Gaffin
Assistant Examiner—Phuong T. Vu
(74) Attorney, Agent, or Firm—Philip R. Wadsworth; Charles D. Brown; Tom Streeter

(57) ABSTRACT

A thin, compliant, electrically and thermally conductive aluminum shim for providing minimum distance circuit path from a power amplifier (or transistor) to the underside of the circuit board (ground). The aluminum shim creates an interference fit between the underside of the circuit board and chassis, which guarantees an electrical connection with the bottom of amplifier and underside of the circuit board. Additionally, with the present invention, post-machining of the chassis during assembly of components is not required since the aluminum shim is sufficiently compliant to conform to both the bottom surface of the amplifier and the existent flatness and surface finish on the chassis produced from the initial machining step. This ensures superior electrical and thermal contact to the chassis regardless of slight imperfections in chassis flatness and surface finish at the seat location, thereby improving reliability and decreasing cost of manufacture and assembly.

7 Claims, 3 Drawing Sheets

MOUNTING ARRANGEMENT FOR MICROWAVE POWER AMPLIFIER

BACKGROUND OF THE INVETION

1. Field of Invention

This invention relates in general to the mounting of microwave devices on circuit boards.

2. Description of Related Art

In power amplifiers operating at frequencies below 30 MHz, the chassis on which the amplifier is mounted effectively operates as a fixed ground reference, since its dimensions are only a fraction of a wavelength. During operation, an object affixed to the chassis may be assumed to be at ground potential. At frequencies above 30 MHz, however, the chassis dimensions and characteristics become significant and it must be considered to be the electrical equivalent of an inductor or transmission line.

In amplifier stages, it is important to have the shortest possible path between the amplifier ground and the ground of the transmission line it interfaces with. In large volume production this ground path must also be very consistent and guaranteed for proper function and reliability.

An amplifier is often mounted directly to the chassis for best heat sinking. If the amplifier's input and/or output leads connect to a circuit board transmission line, the chassis must provide the ground path between the amplifier ground and the circuit board transmission line ground. Small imperfections in the surface of the chassis, amplifier, or circuit board may create a much longer ground path and create a discontinuity between the amplifier and the transmission line. A discontinuity in a transmission line causes undesirable reflections of radio frequency signals that can adversely effect the amplifier's performance.

Surface imperfections may reduce the contact area between the amplifier and the chassis and result in reduced heat sinking for the amplifier. In order to assure the best possible contact between the transistor and chassis, a very flat and smooth surface finish is typically machined into the chassis at a location where the transistor seats. Superior flatness and surface finish provides greatest contact between mating components, which in turn, provides increased thermal and electrical conductivity between components. However, as in most machining operations where different components are manufactured or machined on different machine set-ups, post-machining is typically required of at least one component in order for its mating surface to confonn to its counterpart within the required specifications, or to merely correct imperfections in the initially machined step. Thus, prior to assembly, the location on the chassis where the transistor is seated is typically post-machined in order to meet the flatness and/or surface finish requirement of the interface. To facilitate connection to ground, a thin piece of aluminum is typically placed between the transistor, or other chassis-mounted component, which tends to conform to surface variations in both the transistor and chassis. Post-machining prior to assembly, however, is still required, and though effective in producing an adequate finish on the chassis, this practice is expensive and time consuming.

SUMMARY OF THE INVENTION

Therefore, the object of the present invention is to provide a superior contact between the amplifier (or transistor or other device), chassis, and the underside of the circuit board (ground) without the need to post-machine the chassis in order to meet the requirements of flatness and surface finish for interfacing with transistor, amplifier, or other chassis-mounted components.

The present invention provides a thin, compliant, electrically and thermally conductive aluminum shim device (hereinafter "aluminum shim") to be inserted between a Microwave Monolithic Integrated Circuit (MMIC) amplifier and the chassis to provide a superior electrical and thermal contact to the chassis and to the underside of the circuit board. With the present invention, post-machining of the chassis prior to assembly of components is not required since the aluminum shim is sufficiently compliant to conform to both the bottom surface of the amplifier and the existent flatness and surface finish on the chassis produced from the initial machining step. Also, the aluminum shim creates an interference fit between the underside of the circuit board and chassis, which guarantees an electrical connection with the bottom of amplifier and underside of the circuit board. Thus, the aluminum shim provides a minimum distance and minimum inductance path from the bottom of the amplifier to the underside of the circuit board (ground). The aluminum shim also ensures superior electrical and thermal contact to the chassis and underside of circuit board regardless of slight imperfections in chassis flatness and surface finish at the seat location, thereby improving reliability and decreasing cost of manufacture and assembly. Another advantage of the aluminum shim is that, since the circuit path it creates does not require the chassis to complete the ground path back to the circuit board; the chassis need not be made of electrically conductive material.

It will be evident to those skilled in the art that the present invention is not limited to the use of MMIC amplifiers, but can be utilized for any component which is mounted to the chassis and requires the shortest possible guaranteed ground path while providing a superior thermal ground.

DETAILED DESCRIPTION OF THE PREFERRED EMBODIMENT

Figure 1:
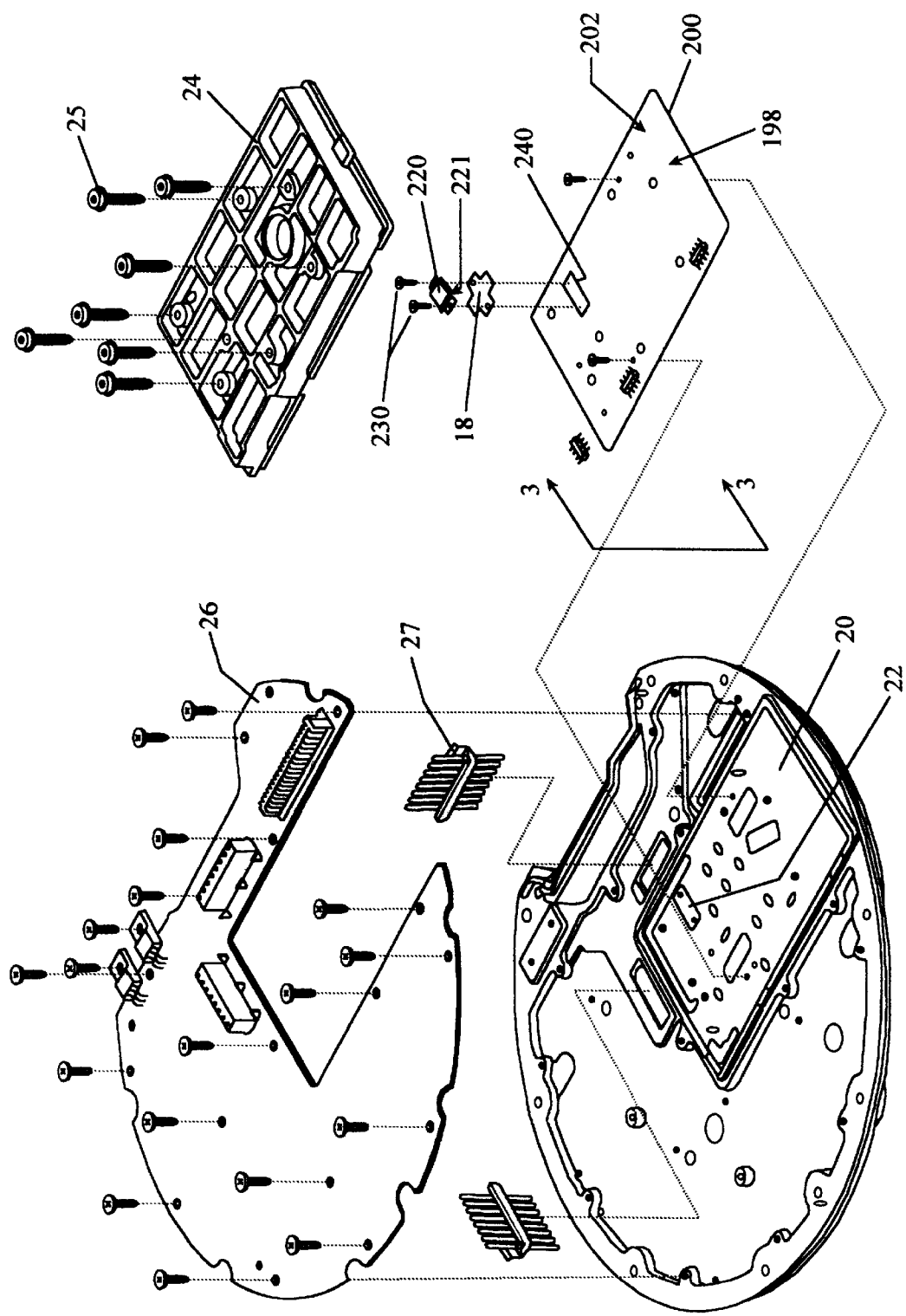
FIG. 1 is an isometric view of the major components of the RF microwave amplifier, showing the assemblage of chassis-mounted component, circuit board, chassis, and aluminum shim.

FIG. 1 shows an assembly of the major components of a RF microwave amplifier. A significant element of the assembly is the thin, compliant, electrically and thermally conductive aluminum shim 18. The major components that the aluminum shim 18 engages are an MMIC amplifier 220, a circuit board 200, and a chassis 20. A slight recess is machined into chassis 20 at location 22 to accommodate amplifier 220. Amplifier 220 has a bottom surface 221, and circuit board 200 has a top side 202 and an underside 198. Also shown in FIG. 1 is an RF cover 24 and hold down screws 25, an analog board 26, and connectors 27, none of which come in direct contact with the aluminum shim 18.

The purpose of aluminum shim 18 is to provide superior electrical contact with bottom surface 221 of amplifier 220 and underside 198 of circuit board 200. Aluminum shim 18 also provides superior thermal contact with bottom surface 221 of amplifier 220 and location 22 of chassis 20. To accomplish this according to the invention, the aluminum shim 18 is placed onto location 22 of chassis 20. Circuit board 200 is placed on top of shim 18 and chassis 20 with circuit board cutout 240 aligned with location 22. Amplifier 220 is then mounted on top of shim 18 inside of circuit board cutout 240, as shown in FIG. 1. The depth of location 22 in chassis 20 is irrelevant to the functionality of aluminum shim 18. If location 22 were coplanar or raised above chassis 20 it would still provide superior thermal and electrical grounding.

Aluminum shim 18 is a thin sheet of aluminum, like aluminum foil, such that it is compliant and essentially without significant mechanical strength. Preferably, the aluminum shim 18 thickness is between 0.001 and 0.003 inches; however, it is obvious to those skilled in the art that the thickness of the aluminum shim 18 is not relevant to its operation, and the thickness dimension is not given as a limitation of the device, but is provided only to give perspective.

Figure 2:
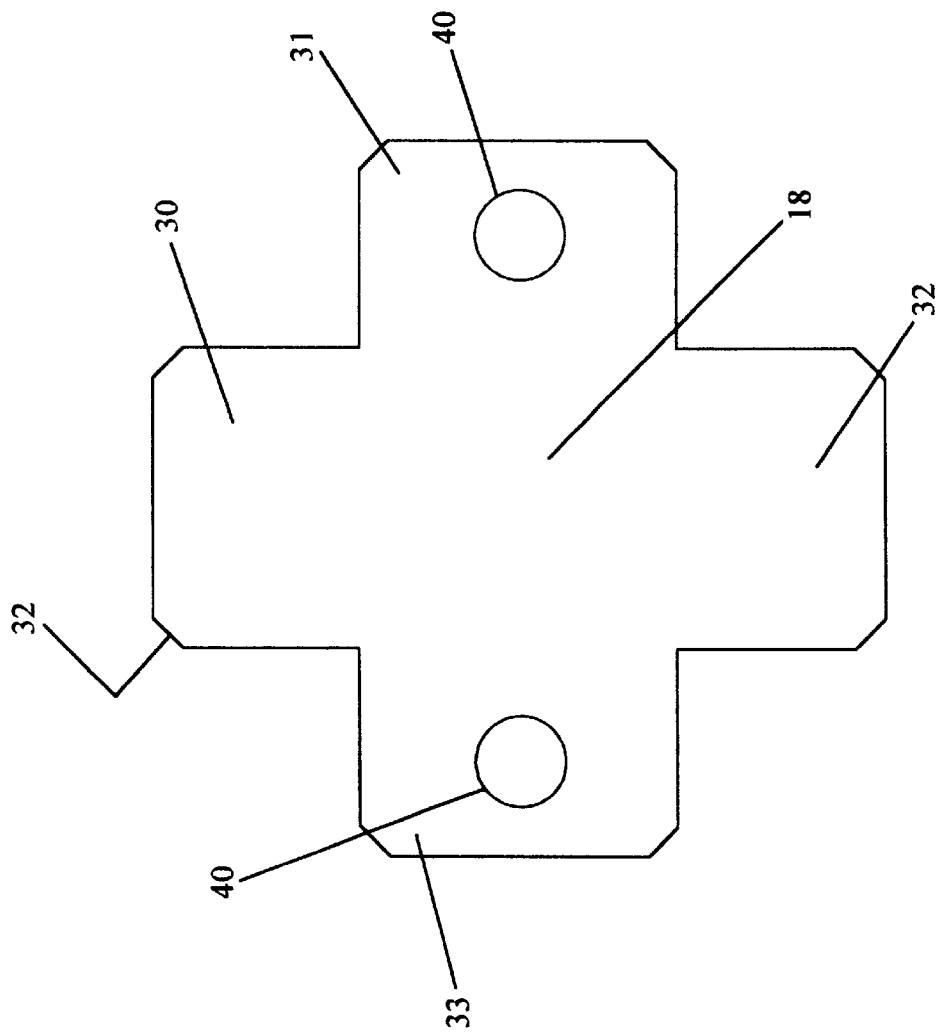
FIG. 2 is a plane view of the aluminum shim.

Aluminum shim 18 is shown in FIG. 2. It is cross-shaped and has four rectangular "wings" 30, 32, 31, and 33. Two holes 40 are placed in two opposing wings, 31 and 33, to accommodate the amplifier 200 hold down screws 230.

Figure 3:
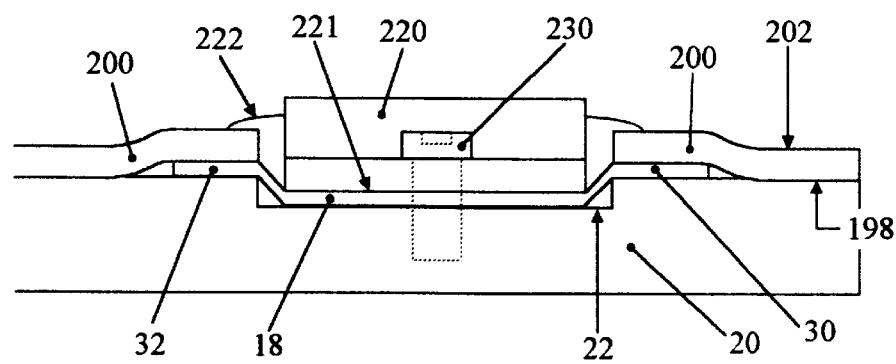
FIG. 3 is cross-sectional view of the aluminum shim assembled with other components according to the present invention.

As shown in FIG. 3, when the entire mounting assembly is fully assembled, two rectangular wings 30 and 32 on the aluminum shim 18 reside underneath the circuit board 200 in direct contact with the circuit board's underside 198. Simultaneously, the aluminum shim 18 is in direct contact with the bottom surface 221 of amplifier 220 and the underside 198 of circuit board 200 where aluminum shim 18 is in direct contact with chassis 20 at location 22. The aluminum shim 18 nestles slightly into the recess at location 22, and when the circuit board 200 and amplifier 220 are installed atop the aluminum shim 18, a slight interference fit is introduced between the aluminum shim 18 and the circuit board 200. This interference fit guarantees electrical contact between the bottom surface 221 of the amplifier 220 and the underside 198 of circuit board 200. The amplifier leads 222 are soldered to the top surface 202 of circuit board 200 in the usual manner.

Figure 4:
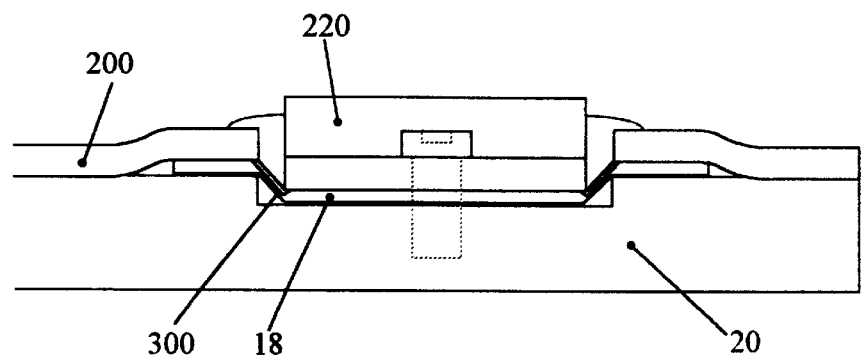
FIG. 4 shows the resultant circuit path with the aluminum shim invention: from the bottom surface of the amplifier, through the aluminum shim, to the underside of the circuit board.

FIG. 4 shows the circuit path 300 created by introducing the aluminum shim 18 into the assembly; the circuit path 300 being: the bottom surface 221 of amplifier 220, through the aluminum shim 18, to the underside 198 (ground) of circuit board 200.

Figure 5:
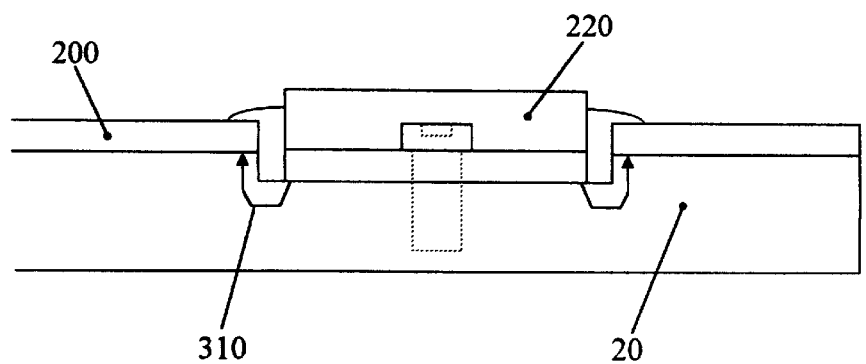
FIG. 5 shows the circuit path without the aluminum shim: from the bottom surface of the amplifier, into the chassis, then through the chassis back to the underside of the circuit board.

In contrast, FIG. 5 shows the longer circuit path 310 that existed prior to the introduction of the aluminum shim 18, which consisted of the following: bottom surface 221 of the amplifier 220, into the chassis 20, then through the chassis back to the underside 198 of circuit board 200.

Therefore, introduction of the aluminum shim 18 provides a significantly shorter distance from the bottom of the amplifier 220 to the underside 198 (ground) of the circuit board 200, which is crucial to minimize discontinuities.

Another advantage of the aluminum shim 18 is that, since the new circuit path 300 does not require the chassis 20 to complete the path back to the circuit board 200, chassis 20 need not be made of electrically conductive material. Thus, making the chassis from electrically nonconductive material, such as plastic, for example, would further reduce the cost of manufacture and assembly.

In summary, use of the aluminum shim 18 allows for superior contact with the amplifier 220, the chassis 20, and the underside 198 of circuit board 200 without the need to post-machine chassis location 22 during assembly. The aluminum shim 18 is sufficiently compliant to conform to surface finish irregularities of both the chassis 20 and amplifier 220, thus providing superior contact. The distance between the amplifier 220 to the underside 198 (ground) of the circuit board 200 is significantly reduced to minimize discontinuities, and the interference fit produced guarantees contact. Additionally, since the new circuit path 300 does not need the chassis to complete the path back to the chassis 20, circuit board 200 need not be made of electrically conductive material.

Although the preferred embodiments of the present invention have been disclosed for illustrative purpose, those skilled in the art will appreciate that various modifications, additions and substitutions are possible. For example, the aluminum shim 18 need not be made from aluminum, but could be made from any compliant material which is electrically and thermally conductive, such as copper, lead, gold, or other compatible material.

What is claimed is:

1. An electronic device mounting arrangement, comprising:
   (a) a chassis having a top side;
   (b) a circuit board having an underside, where the underside of the circuit board faces the top side of the chassis;
   (c) a component directly mounted on the top side of the chassis; and
   (d) a thin, compliant, electrically and thermally conductive material shim placed between the component and the top side of the chassis, and between the underside of the circuit board and the top side of the chassis, such that the shim is simultaneously electrically and thermally in contact with the component, electrically connected with the circuit board, and thermally connected with the chassis.

2. A mounting arrangement according to claim 1 wherein the shim is made of aluminum.

3. A mounting arrangement according to claim 1 wherein the shim is between 0.001 and 0.003 inches thick.

4. A mounting arrangement according to claim 1 wherein:
   (a) the shim is cross-shaped as if two, equal-sized, rectangles intersected each other orthogonally, giving said shim four rectangular protruding sections;
   (b) two opposite sections of the shim contain holes which line up with holes in the chassis and with holes in the component; and
   (c) the rectangle formed from the sections containing the holes is in the same shape as the contact surface area of the component.

5. A mounting arrangement according to claim 1 wherein the shim, when installed, produces an interference fit between the circuit board and the chassis.

6. A mounting arrangement according to claim 1 wherein the shim creates a circuit path along the following route: bottom of the component, through the aluminum shim, to the underside of said circuit board.

7. A mounting arrangement according to claim 1 wherein the chassis is made of a nonconductive material.

* * * * *